United States Patent [19]

Hanna

[11] 4,270,062
[45] May 26, 1981

[54] "D" FLIP-FLOP

[75] Inventor: John E. Hanna, Scottsdale, Ariz.

[73] Assignee: Motorola, Inc., Schaumburg, Ill.

[21] Appl. No.: 15,849

[22] Filed: Feb. 27, 1979

Related U.S. Application Data

[63] Continuation of Ser. No. 887,918, Mar. 17, 1978, abandoned, which is a continuation of Ser. No. 756,167, Jan. 3, 1977, abandoned.

[51] Int. Cl.³ .......................................... H03K 3/289
[52] U.S. Cl. ................................ 307/272 A; 307/291
[58] Field of Search ............... 307/247 R, 272 A, 238, 307/291; 328/206; 365/154, 205

[56] References Cited

U.S. PATENT DOCUMENTS 3,042,815  7/1962  Campbell, Jr. ........................ 307/291
3,622,810 11/1971  Sasaki ............................. 307/272 A Primary Examiner—John Zazworsky
Attorney, Agent, or Firm—Maurice J. Jones, Jr.

[57] ABSTRACT

A "D" flip-flop circuit is disclosed which includes a master latch having data input transistors coupled to the input terminals thereof and data transfer transistors connected to the output thereof. A slave latch is connected to the output terminals of the data transfer transistors. The flip-flop circuit utilizes a resistive feedback network coupled between the emitter terminals of the transistors of the master latch to facilitate increased output voltages and stable predictable operating conditions. The data input transistors are connected as emitter follower circuits for driving the master latch transistors in a common base configuration for maximizing the speed-power product of the circuit.

12 Claims, 2 Drawing Figures

"D" FLIP-FLOP

This is a continuation, of application Ser. No. 887,918, filed Mar. 17, 1978 now abandoned, which is a continuation of application Ser. No. 756,167 filed Jan. 3, 1977 now abandoned.

BACKGROUND OF THE INVENTION

Present day electronic equipment such as frequency synthesizers being utilized in citizen band transceivers often require "D" flip-flops. These bistable multi-vibrators have master and slave portions. Generally, D flip-flops transfer binary information existing at the inputs of the master portion to the slave portion thereof in response to a predetermined transition of a clock signal. This data is stored in and provided at the output terminals of the flip-flop by the slave portion until the next predetermined transition of the clock signal, at which time the data then being supplied to the input terminals of the master portion is stored in the slave portion.

It is desirable for D flip-flops to have high speed-power products. In this context, speed refers to the maximum rate at which the flip-flop can handle data and power is a function of the magnitude of the current drawn by the flip-flop. Low current drain is a particularly advantageous characteristic for flip-flops included in battery operated equipment or in (large scale integration) LSI chips, where it is important to minimize power dissipation. Moreover, it is desirable in some applications for D flip-flops to have low operating voltages to that they can be utilized in portable battery operated equipment or in circuits powered by the electrical system of an automotive vehicle. Also, it is desirable for D flip-flop circuits to have configurations which are simple, to maximize reliability and which take up a minimum amount of space if provided in integrated circuit form. Furthermore, some frequency synthesizer designs, for instance, require D flip-flops which have a speed of operation which is faster than that of $I^2L$ configurations, which are compatible with $I^2L$ circuitry but which are not as complex as prior art emitter coupled logic (ECL) configurations. Most prior art "D" flip-flop configurations do not have one or more of the aforementioned desirable characteristics.

SUMMARY OF THE INVENTION

One object of the invention is to provide an improved circuit configuration for a flip-flop.

Another object of the invention is to provide a configuration for a flip-flop having a high speed-power product.

Still another object of the invention is to provide a flip-flop which is operable at low supply voltages.

A further object of the invention is to provide a flip-flop which is capable of operating at speeds greater than the maximum speed of $I^2L$ circuits and which is compatible with $I^2L$ circuitry.

A still further object of the invention is to provide a configuration for a D flip-flop which is suitable for being manufactured in LSI circuit form.

In brief, the D flip-flop circuit of one embodiment includes a master latch, a data input circuit, a data transfer circuit and a slave latch. The master latch has first and second electron control devices each having first, second and control electrodes. A first feedback circuit interconnects the second and control electrodes of each of the electron control devices. A second feedback circuit interconnects the first electrodes of the electron control devices to assure stable, predictable operating conditions and to maximize the amplitude of the output signals of the master latch. A data input circuit has output terminals connected to the first electrodes of the electron control devices and the data transferring circuit includes input terminals coupled to the output terminals of the master latch. The slave latch is connected between the output terminals of the data transferring circuit and the output terminals of the flip-flop circuit.

DETAILED DESCRIPTION OF THE PREFERRED EMBODIMENT

Figure 1:
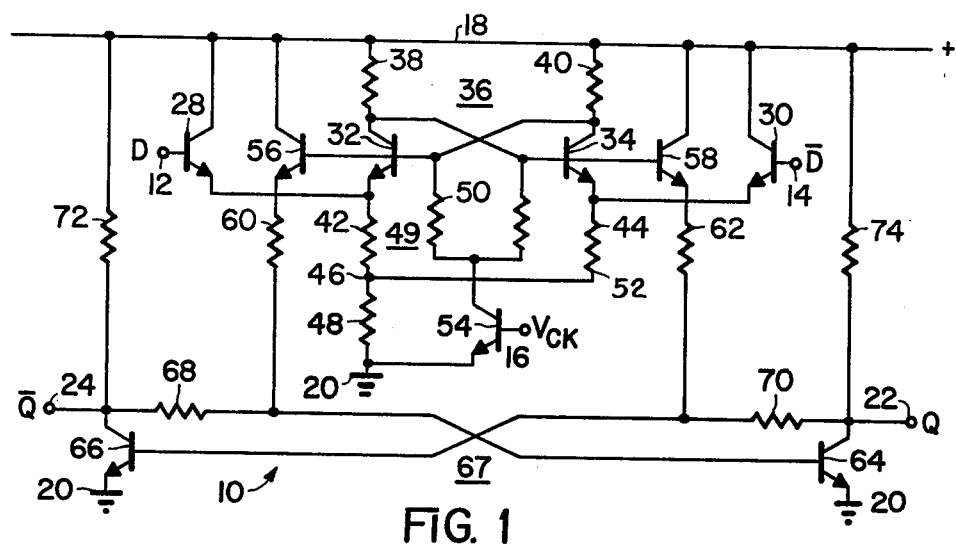
FIG. 1 is a schematic diagram of the D flip-flop of one embodiment of the invention.

FIG. 1 includes a schematic representation of D flip-flop or multi-vibrator 10 of the preferred embodiment of the invention which may be provided in a monolithic integrated circuit. Input terminals 12 and 14 are respectively connected to receive the "D" and "$\overline{D}$" complementary data input signals. Terminal 16 is connected to receive a clock signal. A positive power supply potential is applied to conductor 18 and a relatively negative power supply potential is applied to ground terminals 20 which may be interconnected by a conductor. The "Q" and "$\overline{Q}$" output signals are respectively provided at flip-flop output terminals 22 and 24.

Data entering transistors 28 and 30 respectively have base electrodes connected to data input terminals 12 and 14, collector electrodes connected to power supply conductor 18 and emitter electrodes connected to the emitter electrodes of transistors 32 and 34 of master latch 36. Load resistors 38 and 40 are connected between the respective collectors of the transistors 32 and 34 and the positive supply conductor 18. The collector electrode of transistor 32 is connected to the base electrode of transistor 34, and the base electrode of transistor 34 is connected to the collector electrode of transistor 32. Resistors 42 and 44 are respectively connected between the emitter electrodes of transistors 32 and 34 and node 46. Resistor 48 is connected between node 46 and ground conductor or terminal 20. The base electrodes of transistors 32 and 34 are respectively connected through resistors 50 and 52 to the collector electrode of clock control transistor 54. Transistor 54 further includes a base electrode connected to clock terminal 16 and an emitter electrode connected to conductor 20.

Data transfer transistors 56 and 58 each include collector electrodes connected to conductor 18, base electrodes respectively connected to the base electrodes of transistors 32 and 34, and emitter electrodes connected through resistors 60 and 62 to the respective base electrodes of transistors 64 and 66 of slave latch 67. The collector electrode of transistor 66 is connected through resistor 68 to the base electrode of transistor 64 and the collector electrode of transistor 64 is connected through resistor 70 to the base electrode of transistor 66. Also, resistors 72 and 74 are respectively connected between positive power supply conductor 18 and the collector electrodes of transistors 66 and 64. The emitter electrodes of transistors 64 and 66 are both connected to the ground or negative supply terminal 20. The Q output terminal 22 and the $\overline{Q}$ output terminal 24 of flip-flop 10 are respectively connected to the collectors of transistors 64 and 66.

The purpose of circuit 10 is to transfer the bit of data occurring at data inputs 12 and 14 from master latch 36 to slave latch 67 upon the command of a clock signal. This data is retained in slave latch 67 until the next such clock command. In particular, when the clock signal changes from a high or digital "1" value to a low or digital "0" value, data existing in master latch 36 is transferred to slave latch 67. While the clock signal remains at the "0" state, changes in data at the data input terminals 12 and 14 are ignored by master latch 36. However, as the clock signal changes from a "0" to a "1" level, data can no longer be transferred from master latch 36 to slave latch 67 but the state of master latch 36 is affected by data changes at input terminals 12 and 14.

More specifically, as transistor 54 is rendered conductive by the positive going edge of the clock signal, the base electrodes of transistors 32 and 34 are pulled to a potential near the negative potential at terminal 20. This lowers the emitter voltages of data enter or entry transistors 28 and 30 which can then be rendered conductive or nonconductive depending upon the level of the complementary D signals at data input terminals 12 and 14. So data can then be entered into master latch 36. However, as clock transistor 54 becomes conductive in response to the positive going edge of the clock signal, this also pulls the base electrodes of data transfer transistors 56 and 58 toward a level more nearly approaching that of negative reference potential 20 thereby rendering them nonconductive. Consequently, the data being inputted in master latch 36 cannot be transferred to slave latch 67.

Alternatively, as the clock voltage falls from a high or "1" level to a low or "0" level, clock transistor 54 is rendered nonconductive thereby causing the potential at the collector thereof to rise. Consequently, data transferring transistors 56 and 58 are rendered conductive and transfer the data from master latch 36 to transistors 64 and 66 of slave latch 67. Also, the relatively high potential at the collector of transistor 54 raises the potentials at the base electrodes of transistors 32 and 34 which thereby raises the potential at the emitter electrodes of data entry transistors 28 and 30. This renders transistors 28 and 30 nonconductive and transistors 32 and 34 insensitive to the data applied to terminals 12 and 14. Hence, the D flip-flop circuit 10 has two conditions of operation. One being where data is entered into master latch 36 but not transferred to slave latch 67 and the other being where the data is transferred from master latch 36 to slave latch 67 but data is not entered into master latch 36. Hence, circuit 10 in effect samples and stores data occurring at input terminals 12 and 14 at the time the clock signal changes from the high toward the low state. The stored data is available at output terminals 22 and 24 of slave latch 67.

Cross coupled transistors 32 and 34 of master latch 36 have two positive feedback paths therebetween to ensure that when one of this pair of transistors is on that the other of the pair of transistors is off. One of the feedback paths is from the base electrode of transistor 32 to the collector electrode of transistor 34 and from the base electrode of transistor 34 to the collector electrode transistor 32. The other feedback path involves emitter coupling network 49 which includes resistors 42, 44 and 48. Network 49 provides additional positive feedback between the emitter circuits of transistors 32 and 34 of the master latch to further assure that one of transistors 32 and 34 is off while the other is on.

If resistors 42 and 44, for instance, were connected directly to terminal 20, rather than through resistor 48 to terminal 20, a condition could exist in circuit 10 where both transistors 32 and 34 were on but one would be more conductive than the other. Assume that transistor 32 is on and that transistor 34 is relatively nonconductive, then the base electrode of transistor 34 would be a saturation voltage above the emitter voltage of transistor 32. The voltage at the collector electrode of transistor 32 is established primarily by the supply voltage and the resistive divider including the collector loads resistor 38 and 40 and whatever resistance is connected between the emitter electrode of transistor 32 and ground terminal 20. Now, if data entry transistor 28 starts causing current to be drawn away from transistor 32 because of a noise input voltage on terminal 12, then the voltage at the collector electrode of transistor 32 would also rise. Consequently, the voltage applied across the base-to-emitter junction of transistor 34 also increases so that transistor 34 would start undesirably conducting more current. The collector voltage of transistor 34 would then drop thereby changing the control voltage at the base electrode of transistor 32. Hence, the base and the collector voltages of transistor 32 could be indeterminate at a given instant in time, for instance making data entry constraints harder to calculate.

This problem is solved by cross coupling the emitter resistors 42 and 44 through resistor 48 so that any increase in the emitter voltage of transistor 32, for example, also tends to increase the emitter voltage of transistor 34. As a result, the reference or base potentials for emitter coupled pair of transistors 32 and 34 do not change significantly until full data entry. The emitter cross coupling network, 42, 44 and 48 thus makes the master latch 36 less sensitive to variations in supply voltage, noise and temperature induced changes.

A further advantage of emitter cross coupling network 49 is to increase the drive voltage supplied from master latch 36 to slave latch 67. More particularly, when clock transistor 54 is turned off in response to the negative transition of the clock voltage, the voltage dividers including resistors 38 and 50, 40 and 52 that previously existed between the positive supply conductor 18 and conductor 20 is disconnected. Consequently, the base electrode of the "on" transistor of master latch 36, which is assumed to be transistor 32, goes virtually to the potential of the positive supply. If there was only one resistor between ground and each emitter electrode of transistors 32 and 34, transistor 34 could be partially on under these conditions, which would produce a voltage drop across resistor 40 thereby reducing the base voltages of transistors 32 and 56 thereby reducing the magnitude of the drive voltage applied to slave 67. Emitter cross coupling network 49 between the emitter electrodes of transistors 32 and 34 has the further advantage that is results in a large difference in the magnitude of the drive voltage applied to slave portion 67 by assuring that one of transistors 32 and 34 is off while the other is on. Hence, circuit 10 utilizes a combination of both collector feedback and emitter feedback to provide well defined operating points and drive signals having maximized amplitudes at the output terminals of master latch 36.

As previously mentioned, when the clock voltage supplied to terminal 16 has a high magnitude, data can be entered through transistors 28 and 30 to master latch 36. If input terminal 12 is at a high or "1" potential then transistor 28 is rendered conductive thereby increasing the current through resistor 42. The resulting voltage across resistor 42 tends to reverse bias the emitter-to-base junction of transistor 32 which reduces the conduction thereof. As a result, the voltage at the collector electrode of transistor 32 increases thereby rendering transistor 34 conductive. Thus, a "1" input at terminal 12 results in increased conduction of transistor 34 and reduced conduction of transistor 32. Similarly, a "1" input at terminal 14 would result in increased conduction of transistor 32 and reduced conduction of transistor 34.

Transistors 28 and 30 operate as emitter follower drivers for respective common base connected transistors 32 and 34. Thus, transistors 32 and 34 can operate between conduction and nonconduction faster than if they were driven as common emitter devices, for instance. This is because the internal junction capacitances of common base transistors 32 and 34 appear to have smaller values than if transistors 32 and 34 were connected in common emitter configurations. Therefore, the emitter follower drive of the common base devices utilized in the configuration of circuit 10 allows increased speed of operation without causing the additional current drain that would result from merely lowering resistor values to increase speed. Thus, circuit 10 is suitable for being included in LSI chips or battery operated equipment. Also, the small number of transistors in any current path between supply conductors 18 and 20 enables circuit 10 to operate at relatively low supply voltages thus making it suitable for use in battery operated automotive applications.

Figure 2:
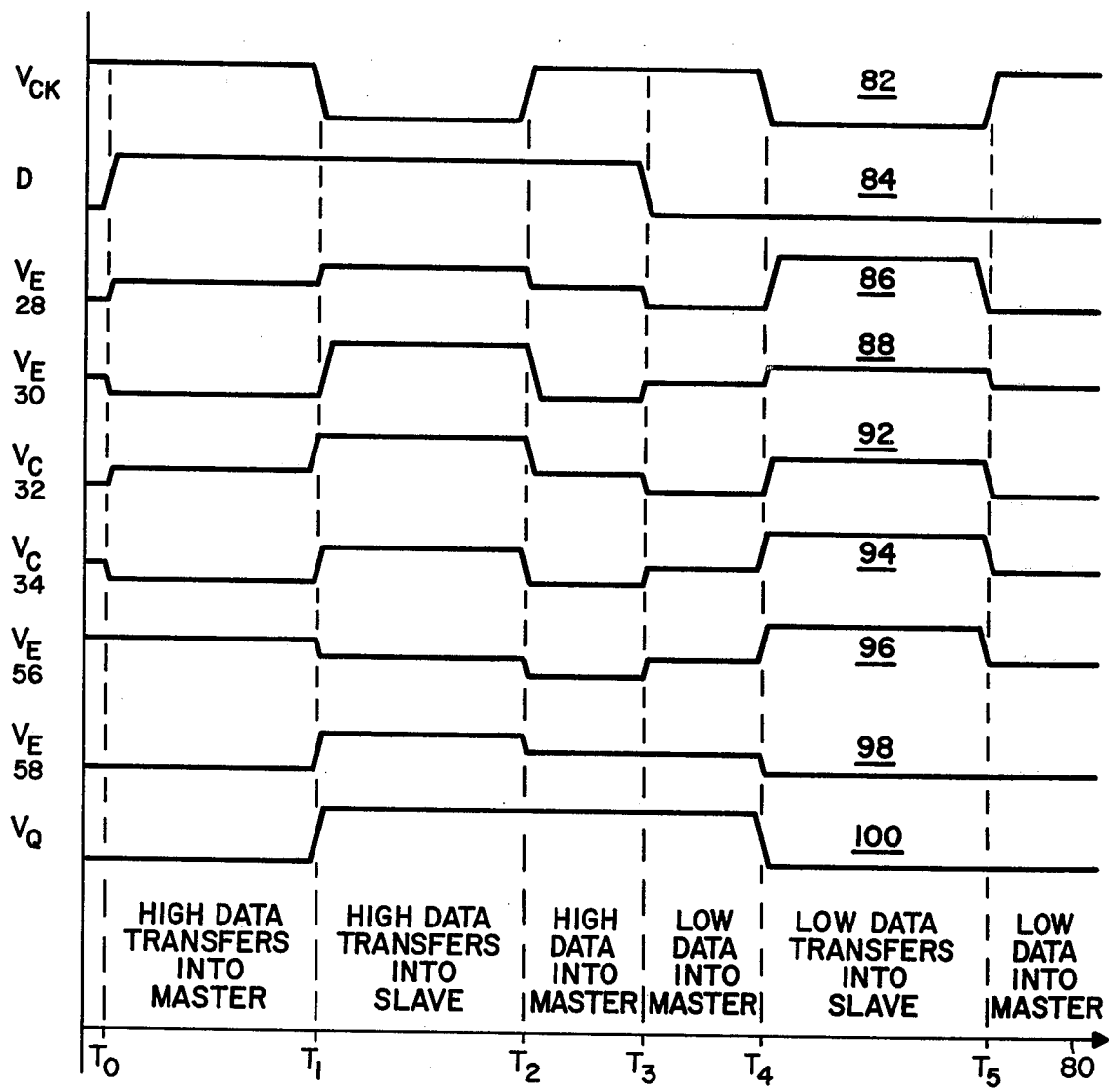
FIG. 2 is a timing diagram illustrating the operation of the D flip-flop of FIG. 1.

The dynamic operation of circuit 10 is further illustrated by the waveforms shown in FIG. 2. Time is indicated along abscissa axis 80 of FIG. 2. At time $T_0$ the voltage of the clock signal ($V_{CK}$), as designated by waveform 82, is at a high state. This causes clock transistor 54 to be conductive. Also at $T_0$, the voltage level of the "D" data at terminal 12 is assumed to change from a low value to a high value, as indicated by waveform 84. Consequently, transistor 28 is rendered more conductive which increases the emitter voltage thereof ($V_{E28}$) as indicated by waveform 86. Also, the complementary D signal applied to terminal 14 tends to render transistor 30 less conductive as indicated by the emitter voltage ($V_{E30}$), illustrated by waveform 88. As a result, transistor 28 provides more current through resistors 42 and 46 thereby developing a voltage which reverse biases the emitter-to-base junction of master latch transistor 32. Hence, the collector voltage of transistor 32 ($V_{C32}$) increases as shown by waveform 92 thereby rendering transistor 34 conductive. Accordingly, the collector voltage of transistor 34 ($V_{C34}$) tends to drop at time $T_0$ as indicated by waveform 94. Consequently, master latch transistor 34 is rendered conductive and master latch transistor 32 is rendered nonconductive in response to the data changing from a high level to low level while the clock signal is at a high level.

Additionally, clock transistor 54 while conductive completes voltage dividers through resistors 50 and 52 to which biases transistors 56 and 58 in a nonconductive condition as indicated by waveforms 96 and 98. Hence, the emitter voltage of transistor 56 ($V_{E56}$), as represented by waveform 96 is determined by the base voltage of transistor 64 while the clock is high. Similarly, the emitter voltage of transistor 58 ($V_{E58}$), as shown by waveform 98 is determined by the base voltage of transistor 66. Consequently, the Q output ($V_Q$) occurring at output terminal 22 and represented by waveform 100 and the $\overline{Q}$ output remain constant between times $T_0$ and $T_1$, while the magnitude of the clock signal is at a high level.

At time $T_1$ the magnitude of the clock voltage ($V_{CK}$) falls as indicated by waveform 92, which renders clock transistor 54 nonconductive. This in effect disconnects the junction of resistors 50 and 52 from ground conductor 20. Consequently, the emitter voltages of transistors 32 and 34 rise in response to the increased base voltages of transistors 32 and 34 and pulls the corresponding emitters of transistors 28 and 30 with them, as illustrated by waveforms 86 and 88. So whereas during the period between time $T_0$ and $T_1$, the emitter voltages of transistors 32 and 34 were established by the emitter voltages of transistors 28 and 30, the converse situation exists between times $T_1$ and $T_2$ when the emitter voltages of transistors 28 and 30 are established by the emitter voltages of transistors 32 and 34. Thus, transistors 28 and 30 are disconnected or isolated from circuit 10. Moreover, the base voltages of transistors 56 and 58 are also increased and transistor 58 is rendered conductive and supplies current to the base of transistor 66. As a result transistor 66 is rendered conductive and transistor 64 is rendered nonconductive by the decreased collector voltage of transistor 66 and the output voltage $V_Q$ increases from a "0" to a "1" at $T_1$, as indicated by waveform 100.

Thus, the signal state at the D input has been transferred to Q output terminal 22 at the falling edge of clock voltage 82. Although the clock voltage, data voltage, and output voltage exist generally at one or the other of two states, the emitter voltages of transistors 28 and 30, the collector voltages of transistors 32 and 34, and the emitter voltages of transistors 34, 56 and 58 have more than two states, as illustrated in FIG. 2. The other signal conditions illustrated by the waveforms of FIG. 2 ought to now be obvious to one of ordinary skill in the art, in view of the foregoing explanation.

An embodiment of the circuit 10 of FIG. 1 suitable for being provided in monolithic integrated circuit form includes resistors having the following values:

| | |
|---|---:|
| 38 and 40 | 1.8 kilohms |
| 42 and 44 | 290 ohms |
| 48 | 1.27 kilohms |
| 50 and 52 | 2.09 kilohms |
| 60 and 62 | 2 kilohms |
| 68 and 70 | 5.1 kilohms |
| 72 and 74 | 3 kilohms |

What has been described is an improved circuit configuration for a resistor transistor logic (RTL) D flip-flop. Flip-flop 10 includes emitter follower data inputting transistors 28 and 30 which drive master latch transistors 32 and 34 which have common base configurations for minimizing junction capacitance effects. Consequently, circuit 10 has a high speed-power product. Thus the amount of energy consumed by circuit 10 at a given data rate is low enough to enable its use in LSI circuit form and in battery operated applications. The circuit of FIG. 10 operates at speeds greater than the maximum speed of $I^2L$ circuits and is compatible with $I^2L$ circuitry. The small number of devices connected between power supply conductors 18 and 20 enables circuit 10 to operate at low supply voltages which facilitates its use in battery powered and automotive applications. Resistive feedback network 49 enables a high degree of immunity to undesired noise, temperature and supply voltage variation by assuring that one of master latch transistors 32 and 34 is nonconductive while the other is conductive. Network 49 also assures maximum potential differences between the base electrodes of transistors 32 and 34 to facilitate high magnitude of the drive signals for slave latch 67. Since circuit 10 has a small number of transistors and resistors it takes up a minimum amount of space in a monolithic integrated circuit structure thereby increasing reliability and decreasing cost. The circuit of FIG. 10 is suitable for use in citizen band transceiver frequency synthesizers.

I claim:

1. A flip-flop circuit including in combination:
   power supply conductor means;
   master latch means having a first transistor and a second transistor, each of said transistors having emitter, collector and base electrodes;
   first feedback means coupling said collector and said base electrodes of said first transistor respectively to said base and said collector electrodes of said second transistor;
   second feedback means having a resistive network connected in a path between said emitter electrode of said first transistor and said emitter electrode of said second transistor, said resistive network providing positive feedback between said first and second transistors to increase noise immunity and stabilize signal levels in said flip-flop circuit;
   means for inputting data having output terminals coupled to said first and second transistors, said means for inputting data including a third transistor having a base electrode adapted to receive data and an emitter electrode directly connected to said emitter electrode of said first transistor and a collector electrode directly and only connected to said power supply conductor means, and a fourth transistor having a base electrode adapted to receive data and an emitter electrode directly connected to said emitter electrode of said second transistor and a collector electrode directly and only connected to said power supply conductor means, said third and fourth transistors thereby operating as emitter followers which respectively drive said emitters of said first and second transistors so that said first and second transistors are operated in common base configurations for maximizing the speed power product of the flip-flop circuit;
   means for transferring data having input terminals and output terminals, said input terminals of said means for transferring data being coupled to said first and second transistors; and
   slave latch means having input terminals coupled to said output terminals of said means for transferring data, said slave latch means having output terminals for providing the output signals of the flip-flop circuit.

2. The flip-flop circuit of claim 1 wherein:
   said first feedback means includes first resistive means connected to said collector electrode of said first transistor, second resistive means connected to said collector electrode of said second transistor, first conductive means connecting said base electrode of said first transistor to said collector electrode of said second transistor, and second conductive means connecting said collector electrode of said first transistor to said base electrode of said second transistor.

3. The flip-flop circuit of claim 1 further including:
   power supply conductor means; and
   said resistive network having first resistive means coupled between said emitter electrode of said first transistor and a circuit junction, second resistive means coupled between said emitter electrode of said second transistor means and said circuit junction, and third resistive means connected between said circuit junction and said power supply conductor means, said resistive network thereby providing positive feedback between said first and second transistors to increase noise immunity and stabilize signal levels in said flip-flop circuit.

4. The flip-flop circuit of claim 1 wherein said means for transferring data includes:
   electron control means having at least first and second electrodes, said first electrode being coupled to said base electrode of said first transistor and said second electrode being coupled to one of said input terminals of said slave latch means; and
   further electron control means having at least first and second electrodes, said first electrode of said further electron control means being coupled to said base electrode of said second transistor and said second electrode of said further electron control means being coupled to another of said input terminals of said slave latch means.

5. A flip-flop circuit suitable for being included in a monolithic integrated circuit having a first power supply conductor and a second power supply conductor, including in combination:
   data inputting means having input terminals adapted for receiving data and having output terminals;
   master latch means coupled to said data inputting means and having first and second transistors each with emitter, base and collector electrodes;
   resistive network means coupling said emitter electrodes of said first and second transistors of said master latch means to each other, said resistive network means having first resistive means connected between said emitter electrode of said first transistor and a circuit junction, second resistive means connected between said emitter electrode of said second transistor and said circuit junction, and third resistive means coupled between said circuit junction and said second power supply conductor;
   third transistor means having a control electrode coupled to receive a clock signal, a first electrode coupled to said second power supply conductor, and a second electrode;
   fourth resistive means coupled between said second electrode of said third transistor means and said base electrodes of said first and second transistors;
   data transferring means having input terminals connected to said master latch means and output terminals; and
   slave latch means having input terminals coupled to said output terminals of said data transferring means.

6. The flip-flop circuit of claim 5 wherein said data inputting means includes fourth and fifth transistors each having emitter, base and collector electrodes, said collector electrodes of each of said fourth and fifth transistors being connected to said first power supply conductor, said base electrodes of said fourth and fifth transistors being adapted to receive data, and said emitter electrodes of said fourth and fifth transistor being respectively coupled to said emitter electrodes of said first and second transistors of said master latch means.

7. The flip-flop circuit of claim 5 wherein said data transferring means includes fourth and fifth transistors each having emitter, base and collector electrodes, said collector electrodes of each of said fourth and fifth transistors being connected to said first power supply conductor, said base electrodes of said fourth and fifth transistors being respectively coupled to said base electrodes of said first and second transistors, and said emitter electrodes of said fourth and fifth transistors being coupled to said input terminals of said slave latch means.

8. The flip-flop circuit of claim 5 further including:
fifth resistive means connecting said base electrode of said second transistor to said first power supply conductor; and
sixth resistive means connecting said base electrode of said first transistor to said first power supply conductor so that said fourth and sixth resistive means form a voltage divider at the base electrode of said first transistor in response to said third transistor means being rendered conductive and said fourth and fifth resistive means forms a voltage divider at the base electrode of said second transistor in response to said third transistor means being rendered conductive.

9. A flip-flop circuit suitable for being fabricated as part of a monolithic integrated circuit having a first power supply conductor and a second power supply conductor, including in combination:
data inputting means having input terminals adapted for receiving data and having output terminals;
master latch means coupled to said data inputting means and having first and second transistors each with emitter, base and collector electrodes;
resistive network means coupling said emitter electrodes of said first and second transistors of said master latch means to each other;
third transistor means having a control electrode coupled to receive a clock signal, a first electrode coupled to said second power supply conductor, and a second electrode;
first resistive means coupled between said second electrode of said third transistor means and said base electrodes of said first and second transistors;
data transferring means having input terminals connected to said master latch means and output terminals; and
slave latch means having input terminals coupled to said output terminals of said data transferring means.

10. The flip-flop circuit of claim 9 wherein said data inputting means includes fourth and fifth transistors each having emitter, base and collector electrodes, said collector electrodes of each of said fourth and fifth transistors being connected to said first power supply conductor, said base electrodes of said fourth and fifth transistors being adapted to receive data, and said emitter electrodes of said fourth and fifth transistors being respectively coupled to said emitter electrodes of said first and second transistors of said master latch means.

11. The flip-flop circuit of claim 9 wherein said data transferring means includes fourth and fifth transistors each having emitter, base and collector electrodes, said collector electrodes of each of said fourth and fifth transistors being connected to said first power supply conductor, said base electrodes of said fourth and fifth transistors being respectively coupled to said base electrodes of said first and second transistors, and said emitter electrodes of said third and fourth transistors being coupled to said input terminals of said slave latch means.

12. The flip-flop circuit of claim 9 further including:
second resistive means connecting said base electrode of said second transistor to said first power supply conductor; and
third resistive means connecting said base electrode of said first transistor to said first power supply conductor so that said first and third resistive means form a voltage divider at the base electrode of said first transistor in response to said third transistor means being rendered conductive and said first and second resistive means forms a voltage divider at the base electrode of said second transistor in response to said third transistor means being rendered conductive.

* * * * *